United States Patent [19]

Davidson et al.

[11] 4,398,106

[45] Aug. 9, 1983

[54] ON-CHIP DELTA-I NOISE CLAMPING CIRCUIT

[75] Inventors: Evan E. Davidson, Hopewell Junction; George A. Katopis, Fishkill; Barry J. Rubin, Flushing, all of N.Y.

[73] Assignee: International Business Machines Corporation, Armonk, N.Y.

[21] Appl. No.: 218,150

[22] Filed: Dec. 19, 1980

[51] Int. Cl.³ ........................ H03H 11/46; H03H 5/12

[52] U.S. Cl. ................................ 307/549; 307/200 A; 307/551; 365/206

[58] Field of Search ............... 365/206, 226, 227, 228; 307/542, 544, 549, 551, 565, 200 A, 247 A, 296 R

[56] References Cited

U.S. PATENT DOCUMENTS

| | | | |
|---|---|---|---|
| 3,859,638 | 1/1975 | Hume, Jr. | 365/228 |
| 3,936,863 | 2/1976 | Olmstead | 307/318 |
| 4,027,177 | 5/1977 | Davis | 307/303 |
| 4,095,163 | 6/1978 | Montague | 307/542 |
| 4,220,876 | 9/1980 | Ray | 307/559 |
| 4,323,792 | 4/1982 | Bergmann et al. | 307/549 |

FOREIGN PATENT DOCUMENTS

| | | | |
|---|---|---|---|
| 1166255 | 3/1964 | Fed. Rep. of Germany | 307/237 |

OTHER PUBLICATIONS

M. Taub & D. Schilling, *Digital Integrated Electronics*, McGraw-Hill, 1977, pp. 241-243, and 306.

A. R. Berding, "Transistor with a Controlled Beta", *IBM Tech. Disc. Bull.*; vol. 10, #2; Jul. 1967, pp. 182-183.

A. Debrita, H. Geller, M. Yungfleisch, "Noise Suppression Circuit", *IBM Tech. Disc. Bull.*; vol. 15, #1; Jun. 1972, p. 259.

S. Wiedmann, "Low-Voltage Clipping Circuit", *IBM Tech. Disc. Bull.*; vol. 11, #10; Mar. 1969, p. 1367.

*Primary Examiner*—Stanley D. Miller
*Assistant Examiner*—David R. Hudspeth
*Attorney, Agent, or Firm*—Sughrue, Mion, Zinn, and Macpeak

[57] ABSTRACT

A clamping circuit to reduce self-induced switching noise in a multi-chip module semiconductor structure. A module section interconnects the chips and the chips have a power supply and power leads respectively. An impedance path is defined between each of the chips and the power supply to define a current path for switching noise through the top of the module. A high impedance path is defined for voltages below a predetermined upper limit of the chip supply voltage and a low impedance path is defined by the clamping circuit for the voltage range where noise superimposed on the chip supply voltage occurs.

9 Claims, 6 Drawing Figures

ON-CHIP DELTA-I NOISE CLAMPING CIRCUIT

FIELD OF INVENTION

This invention relates to the reduction of switching noise caused by package inductance in computer circuits. In particular, the invention relates to a noise clamping circuit for eliminating self-induced switching noise (Delta-I noise) caused by inherent package inductance in semiconductor chips.

BACKGROUND OF THE INVENTION

An important limitation in the advancement of packaging technology for higher performance in computer circuitry is the reduction of self-induced switching noise caused by inherent package inductances. Thise noise is generally known as Delta-I noise. Given constraints in today's multi-chip module (MCM) technology, there are nearly no degrees of freedom available for improvement in this area. Conventional noise flow in a chip can be considered in detail by reference to FIG. 1 which shows two communicating chips, "Chip 1" and "Chip 2" within a MCM. FIG. 1 shows Chip 1 utilized as a driver indicated by the switch S while Chip 2 is used as receiver indicated by a terminating resistor, $T_R$. A module section "module" interconnects the two chips and contains a signal line and two reference planes disposed on either side of the signal line. Two power vias disposed underneath each of the chip sites are coupled through large decoupling capacitances C1 and C2 on the board.

In operation, when the driver, Chip 1 switches on, that is switch S closes, current passes down the signal line to the terminator TR for the case where $V_{cc}$ is positive with respect to $V_R$. This current enters the $V_R$ via and travels down the module to the $V_R$ reference plane. FIG. 1 shows a fraction of the current passing back toward the sending chip while the remainder goes to the board through the decoupling capacitors C2 and back up to the Chip 2 $V_{cc}$ reference plane. This is shown by the dotted line arrow in the righthand portion of FIG. 1.

When the $V_{cc}$ reference plane current arrives at Chip 1, the current loop is completed by flowing through the driver. It should be noted, however, that the $V_R$ reference plane current must flow down to the board under Chip 1 and return through the $V_{cc}$ via before it can complete its loop. This is shown in the lefthand lower portion of FIG. 1 by the dotted line arrow. When the C1 current merges with the C2 current, the board then experiences the full driver current. Also, it should be noted that even though the board capacitors are interconnected the return currents must and do flow through the reference planes in order to provide for a controlled characteristic impedance.

As shown in FIG. 1, all of the driver current must travel to the board to complete the current path. Accordingly, the effective package inductance is relatively high even in a system utilizing intramodule communication. Given the current paths of FIG. 1, a negative Delta-I noise component is introduced at the Chip 1 $V_{cc}$ and a positive Delta-I noise component is introduced at the Chip 2 $V_R$. When these noise components are present on the chip power supplies, they may propagate onto quiet lines potentially resulting in false switching of quiet receivers.

Accordingly, an important consideration in reducing system susceptibility to noise is the ability to reduce the magnitude of the effective package inductance. Such a reduction produces a corresponding reduction in the magnitude of the noise component.

Given the noise current flow paths depicted in FIG. 1, one technique for reducing effective package inductance is to have the high frequency noise current circulate near the top of the module as opposed to traveling down to the board. Such a path would bypass most of the module and the board inductance. A potential technique for accomplishing this goal would be to introduce top surface module decoupling capacitors. However, within the limits of known technology, this solution is currently not feasible for use with practiced MCM techniques. Available decoupling capacitors are not compatible with existing MCM technology because excessive topside area would have to be set aside for their inclusion. This would reduce the number of chips and circuits that could be placed on the MCM significantly detracting from its overall performance and economic advantages. Furthermore, additional power planes would have to be added at the top of the MCM to provide a low inductance path between the capacitors and the chips making the module even more complex and more expensive to produce.

Therefore, an incentive remains to provide an on-chip virtual decoupling capacitor that may be synthesized within the existing chip technology.

Within the prior art, various techniques are known for suppressing positive and negative going noise pulses in chips. Noise suppression circuits are shown generally in U.S. Pat. Nos. 3,816,762 and 3,898,482. Also, integrated circuit clamping circuits are shown in U.S. Pat. Nos. 3,654,530; 4,027,177; 4,085,432; and 4,131,928. Those prior art patents do not deal specifically with the concept of reducing effective package inductance by rerouting the high frequency noise currents for circulation near the top of the module. Rather, they deal with circuits to suppress noise rather than attempting to eliminate the noise components per se.

SUMMARY OF THE INVENTION

Given the deficiencies in the prior art, it is an object of this invention to create an on-chip impedance characteristic that interconnects the power supplies allowing module currents to complete their loops on-chip.

Another object of this invention is to define a low impedance path for noise current that will flow near the top of a module and bypass a majority of package inductance.

Yet another object of this invention is to define an on-chip circuit that will reduce the Delta-I noise in MCM components.

These and other objects of this invention are accomplished by first defining an on-chip impedance characteristic connecting the power supplies that allow the module currents to complete their loops on-chip. The I-V characteristic operates at low voltages with an effective high impedance while, in a transition region, the effective impedance is low. Above the upper voltage level in the transition region, the effective impedance is again high. If the transition region is defined by two voltages V1 and V2, V1 represents the upper limit of normal chip supply voltage and a linear region with an upper level V2 defines the range where noise when superimposed upon the voltage supply can occur. The impedance above V2 is utilized so that large chip currents will not flow during power supply over voltage conditions.

If a circuit synthesizing this impedance characteristic is placed between the $V_{cc}$ and $V_R$ power chip leads when noise is generated by switching of the drivers there is a low impedance path for the noise current to flow near the top of the module. This effectively bypasses most of the package inductance causing a significant reduction in Delta-I noise. Moreover, the noise current flow now is directed through parallel via paths $V_{cc}$ and $V_R$ to each chip thereby further reducing the effective inductance.

This invention will be described in greater detail by referring to the accompanying drawings and the description of the preferred embodiments which follow.

DESCRIPTION OF THE PREFERRED EMBODIMENTS

Figure 2:
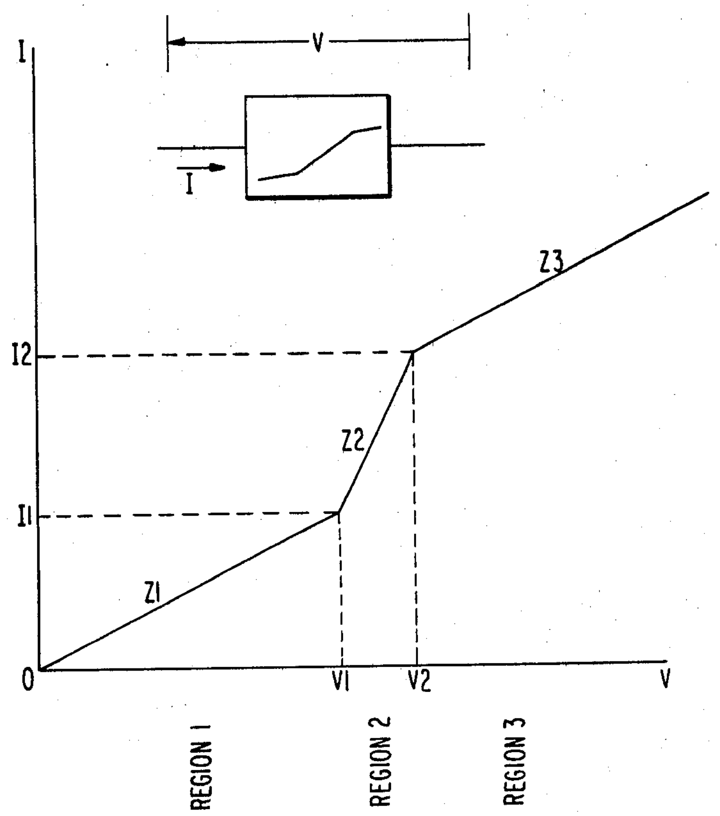
FIG. 2 is a plot of the impedance characteristic of the noise clamp circuit in accordance with the present invention.

Referring now to FIG. 2, an on-chip impedance characteristic is schematically shown that interconnects the power supplies to allow the module currents to complete their loops on-chip. Considering the graph of FIG. 2, at low voltages, the effective impedance is high while between the voltage level V1 and V2, the effective impedance is low. In region 3, above voltage level V2 the effective impedance is again high. Assuming that V1 represents the upper limit of normal chip supply voltage and V1 and V2 define the range where noise, when superimposed upon the supply voltage can occur, then, the characteristic shown is clearly desirable. The impedance in region 3, that is above voltage V2, is high so that large chip currents will not flow during a power supply overvoltage conditon.

Figure 1:
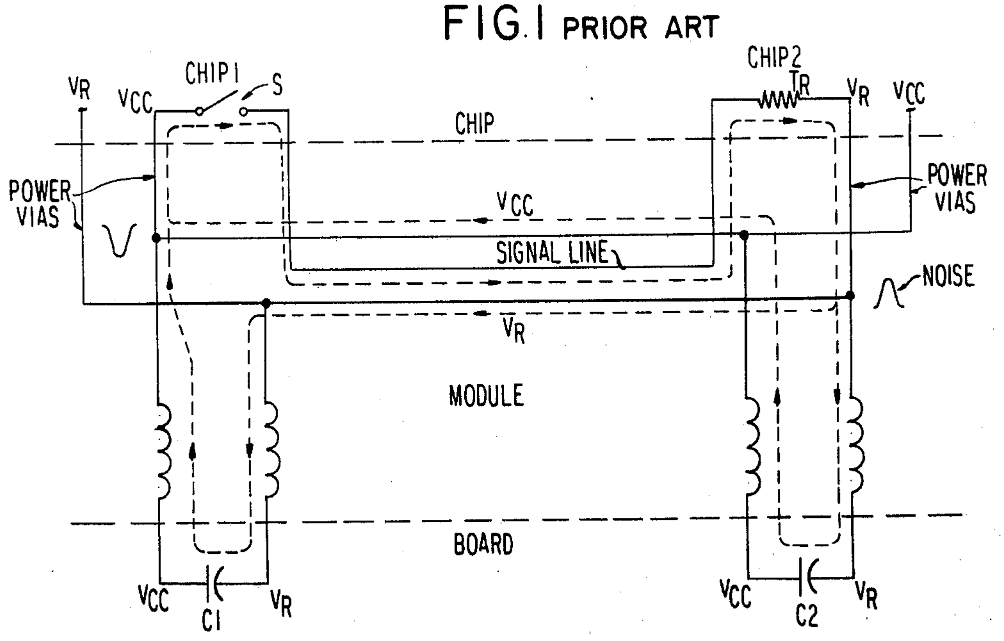
FIG.1 PRIOR ART
FIG. 1 is a schematic diagram showing conventional noise current flow paths between two chips.
Figure 3:
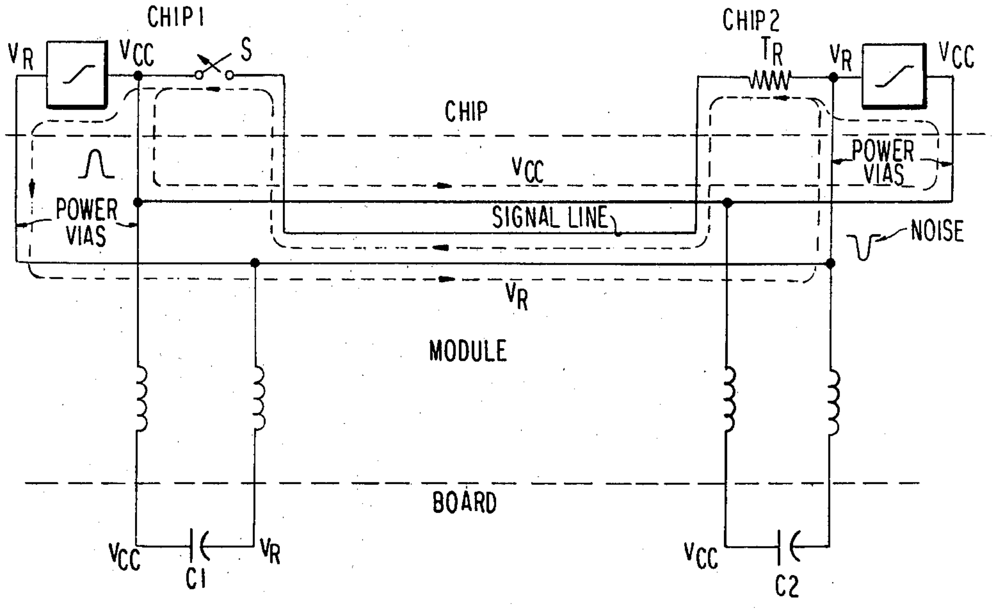
FIG. 3 is a noise current flow diagram in accordance with the present invention.

Referring now to FIG. 3, the impedance characteristic shown in FIG. 2 is placed between the chip power leads $V_{cc}$ and $V_R$. The module current paths are shown by the dotted line arrows corresponding to the case where the drivers are switched off which reverses the flow from that shown in FIG. 1. In FIG. 3, noise generated by switching the drivers results in a low impedance path for the noise current to flow near the top of the module. This path effectively bypasses most of the package inductance resulting in a significant reduction in Delta-I noise. Moreover, the noise current, as shown in FIG. 3, flows to parallel via paths ($V_{cc}$ and $V_R$) to each chip resulting in a further reduction in effective indutance.

FIG. 3 shows that the reduction of package inductance, and therefore, a reduction in Delta-I noise is achieved by forcing the high frequency noise currents to circulate near the top of the module. This circulation route bypasses most of the module and the board inductance. The on-chip circuitry exhibiting the impedance characteristic of FIG. 2 therefore defines the path between power supplies where no other satisfactory on-chip return current path exists.

Figure 4:
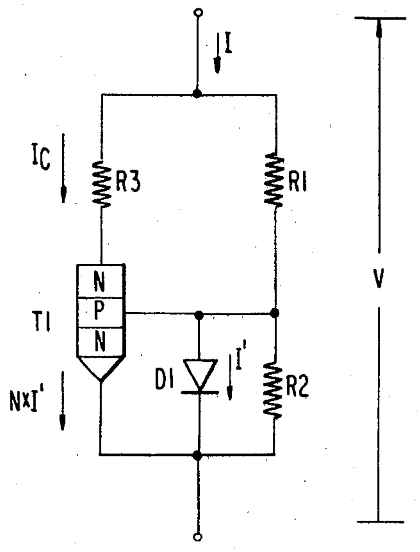
FIG. 4 is a circuit diagram of a unipolar noise clamp that synthesizes the impedance characteristic of FIG. 2.

FIG. 4 shows a unipolar noise clamp circuit synthesizing the impedance characteristic of FIG. 2. At low values of V, the transistor T1 and the diode D1 are off and the terminal resistance is therefore determined by the series combination of resistors R1 and R2. As V increases, D1 and T1 turn-on when V is equal to the voltage V1, a value set by the R1–R2 voltage divider. Once in the linear region, between V1 and V2, the gain of the transistor T1, having the base-emitter junction that is N times larger than the area of D1, is set by the current mirror effect between the two elements. This significantly reduces the terminal resistance above V1. In the third region, above V2, T1 saturates as determined by the value of R3 and the terminal resistance reverts to a higher level which is set by the parallel combination of R1 and R3.

The circuit design equations to achieve the preferred impedance characteristic of FIG. 2 will now be derived.

With reference to FIG. 4, the voltage divider ratio, k, for the base drive can be defined as:

$$k = \frac{R2}{R1 + R2} \tag{1}$$

k will be used in the subsequent equations for the sake of compactness. Next, the equations for all of the values labeled in FIG. 2 will be derived.

REGION 1: CUTOFF ($0 \leqq V \leqq V1$)

Since the transistor (T1) and the diode (D1) are assumed to be conducting a negligible amount of current, the total current in this region is:

$$I = \frac{V}{R1 + R2} \tag{2}$$

By differentiating V with respect to I, the impedance, Z1, is:

$$Z1 = R1 + R2 \tag{3}$$

The turn-on voltage, V1 is:

$$V1\,0.8/k \tag{4}$$

where 0.8 volts is the turn-on voltage for D1 and the base-emitter junction of T1. From Equations 2 and 4, the current corresponding to turn-on is:

$$I1 = 0.8/R2 \tag{5}$$

REGION 2: LINEAR ($V1 < V < V2$)

With D1 and T1 conducting in the linear region, the collector current, $I_C$, can be written as:

$$I_C = \frac{N(kV - .85)}{kR1} \tag{6}$$

where, N is the current mirror area ratio between D1 and the base-emitter junction area of T1 and 0.85 volts is the corresponding ON voltage for these junctions.

By including the current in R1, the total linear region current when T1 is fully conducting is:

$$I = \frac{V - .85}{R1} + \frac{N(kV - .85)}{kR1} \quad (7)$$

REGION 3: SATURATION

When the current through R3 increases to the point that T1 saturates, the expression for collector current is:

$$I_C = \frac{V - .15}{R3} \quad (8)$$

where, 0.15 volts is the value for the saturated collector-to-emitter voltage. Adding the additional current through R1 the total saturation current becomes:

$$I = \frac{V - .15}{R3} + \frac{V - .85}{R1} \quad (9)$$

Differentiating Equation 9 with respect to V and inverting, the saturation impedance, Z3, is obtained:

$$Z3 = \frac{(R1)(R3)}{R1 + R3} \quad (10)$$

Since the linear collector current (Equation 6) and the saturation collector current (Equation 8) are equal at the point of saturation when V is equal to V2, Equation 8 can be equated to Equation 6 and solved for V2 as shown:

$$V2 = \frac{.85N(R3) - .15k(R1)}{Nk(R3) - k(R1)} \quad (11)$$

From Equation 9, the corresponding total current at the point of saturation is:

$$I2 = \frac{V2 - .15}{R3} + \frac{V2 - .85}{R1} \quad (12)$$

Using Equations 4, 5, 11, 12 one can calculate the linear region impedance, Z2, as follows:

$$Z2 = \frac{V2 - V1}{I2 - I1} \quad (13)$$

This completes the set of equations required for defining all of the parameters indicated in FIG. 2.

A design example of the FIG. 4 embodiment synthesizing the impedance characteristic of FIG. 2 can be delineated by assigning a value of 25 ohms for all resistors, R1, R2, and R3 of FIG. 4. At that assigned value, N as delineated in Equation 6 is equal to 9. Z1, the sum of R1 and R2 is 50 ohms, and V1 becomes 1.6 volts with I1 32 ma. In the linear zone, Z2 becomes 3.75 ohms and in the saturation region, region 3, V2 is 1.5 volts with I2 112 ma. The saturation impedance Z3 derived from Equation 10 is 12.5 ohms. Simulation results verify the accuracy of the impedance characteristic which is derived utilizing the above given values. Moreover, the design parameters are quite controllable as has been shown by statistically varying the device parameters in a circuit simulation program.

Figure 5:
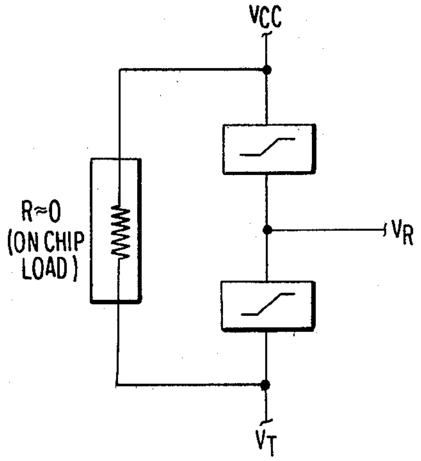
FIG. 5 shows a decoupling network interconnecting the circuit of FIG. 4 in a decoupling network for $V_R$.

In the practical embodiments of this invention, it must be recognized that there is a low impedance existing between some of the power supplies due to the normal on-chip load while other supplies are not heavily loaded. Hence, no acceptable on-chip return path exists. In this case, the circuit of FIG. 4 finds specific utilization. In a typical case, $V_{cc}$ has a low impedance to $V_T$ but $V_R$ has high impedance to $V_{cc}$. Accordingly, by referring to FIG. 5, a decoupling network for $V_R$ is shown where the circuit of FIG. 4 is interconnected between $V_{cc}$, $V_T$ and $V_R$. In this arrangement, all of the supplies are now effectively decoupled to each other insofar as positive and negative $V_R$ noise currents are considered. This conclusion is premised on the values of $V_{cc}$ and $V_T$ being large enough to bias the circuit of FIG. 4. It has been shown that the FIG. 5 decoupling network can reduce noise to a value of approximately 60% on the $V_R$ supply.

A secondary effect of the present invention is that in addition to providing low impedance for noise, the circuit of FIG. 4 is a high impedance for normal voltage passband and for any overvoltage condition. This results in an overall small contribution to chip power. The result then is an effective low power noise clamp on, alternatively, an on-chip virtual decoupling capacitor that significantly reduces module Delta-I noise. This property is especially advantageous in ECL logic utilized on digital computer chips wherein the exact circuit condition exists, that is, $V_{cc}$ having a low impedance to $V_T$ but $V_R$ a high impedance to $V_{cc}$ and $V_T$.

Figure 6:
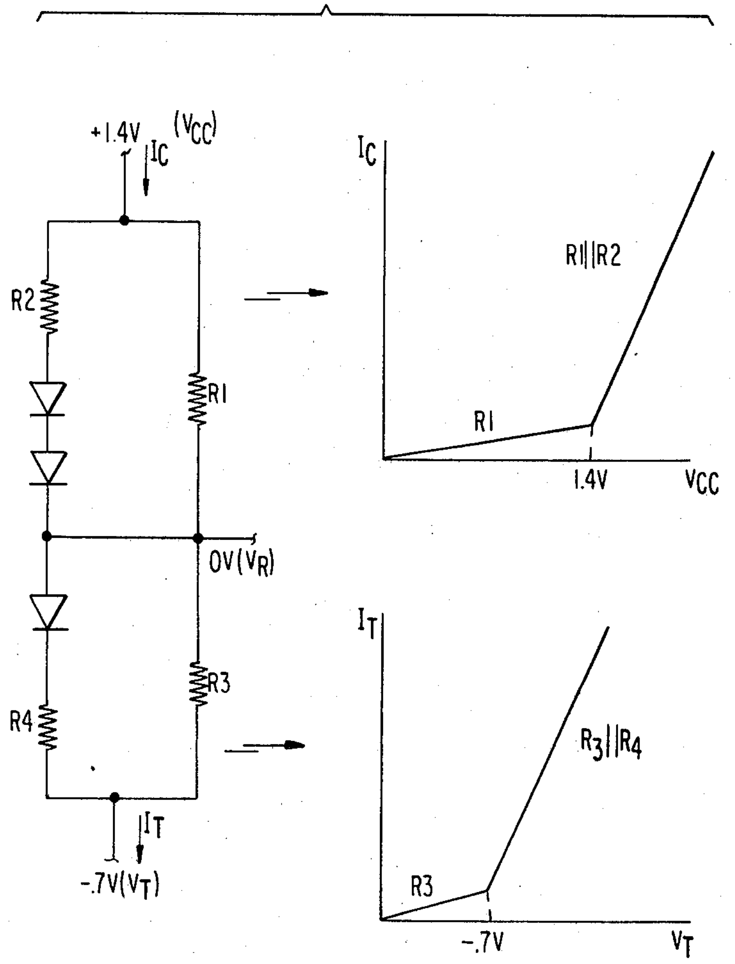
FIG. 6 shows a modification of the synthesized circuit for a particular set of voltage levels.

Referring now to FIG. 6, the impedance characteristic of FIG. 2 is synthesized in a slightly different characteristic arrangement. The impedance characteristics shown in the righthand graphs of FIG. 6 are similar to those of FIG. 2 except that the high current portions do not exhibit a current limitation by reversion to a higher impedance level. In FIG. 6, the break point is controlled by the turn-on voltages of the diode rather than the more versatile turn-on level for the transistor-voltage divider combination of FIG. 4. The circuit of FIG. 6 is effective as a decoupling capacitor but lacks the current limiting aspects of overvoltage conditions of the FIG. 4 embodiment. It does, however, utilize the same fundamental impedance characteristics of FIG. 2 for a particular choice of voltage levels as shown in that Figure. The FIG. 6 embodiment represents an example of this aspect of the invention for an array of memory or logic gates (hundreds) placed on a chip and used in a high speed computer main frame.

It is apparent that modifications of this invention can be made without departing from the essential scope of the invention.

We claim:

1. In a semiconductor structure having a pair of semiconductor chips each having a pair of power leads, one chip defining a driver communicating with a second chip defining a receiver, a module section packaging and inter-connecting said pair of chips, said module section having a signal plane and two reference planes on either side of said signal plane, a pair of power vias disposed under said pair of chips and coupled to each other through decoupling capacitances, the improvement comprising; means coupled between said pair of chip power leads of each chip defining an on-chip impedance characteristic having at least one high impedance region and a low impedance region, for interconnecting the power vias for allowing substantially all module currents to complete current loops on-chip.

2. A clamping circuit to reduce self-induced switching noise in semiconductor structure comprising; a pair of semiconductor chips, a module section packaging and interconnecting said chips, means defining a power supply to said chips and, on-chip means coupled between the leads of said power supply defining a voltage-variable impedance to provide a low impedance current path for switching noise through the top of the module.

3. In a circuit for reducing self-induced switching noise in a multichip semiconductor structure packaged and interconnected by a module section, a power supply delivering a supply voltage to each chip, the improvement comprising; means coupled between the leads of said power supply on said chip defining a high impedance current path for voltages below a predetermined upper limit of chip supply voltage and a low impedance path for a voltage range above said predetermined upper limit where noise superimposed upon said chip supply voltage occurs thereby defining a current path through the top of said module.

4. The circuit of claim 1, 2 or 3 wherein said coupling means comprises a transistor, first and second series coupled resistors in parallel with said transistor, and a diode in parallel with one of said resistors and said transistor.

5. The circuit of claim 4 wherein a high impedance path is created by the series combination of said first and second resistors for voltage levels below a predetermined first upper limit, and a low impedance path created above the first upper limit in a linear region where said transistor and diode are conducting.

6. The circuit of claim 5 wherein said predetermined upper limit is a function of the resistance values of a voltage divider formed by said first and second resistors.

7. The circuit of claim 4 wherein said transistor has a base-emitter junction N times larger in cross-section than the junction of said diode and a gain defined by the current mirror effect between said transistor and said diode.

8. The circuit of claim 4 further comprising a third resistor in series with said transistor and wherein said third resistor defines the saturation point of said transistor and above the said saturation point a high impedance path is defined by the parallel combination of said first and third resistors.

9. The circuit of claim 1, 2 or 3 wherein said coupling means comprises a circuit comprising first and second resistors in parallel, a pair of diodes in series with said second resistor, a third resistor in series with said first resistor an output terminal between said first and third resistors and, a fourth resistor coupled in series with a third diode that is in parallel with said third resistor.

* * * * *

UNITED STATES PATENT AND TRADEMARK OFFICE
CERTIFICATE OF CORRECTION

PATENT NO. : 4,398,106
DATED : August 9, 1983
INVENTOR(S) : DAVIDSON et al

It is certified that error appears in the above—identified patent and that said Letters Patent is hereby corrected as shown below:

Column 1, line 16, change "Thise" to -- This --

Column 4, line 13, following "having" change "the" to -- a --.

Signed and Sealed this

*Fifteenth* Day of *May 1984*

[SEAL]

*Attest:*

GERALD J. MOSSINGHOFF

*Attesting Officer* *Commissioner of Patents and Trademarks*